(12) United States Patent
Rathsack et al.

(10) Patent No.: US 8,318,607 B2
(45) Date of Patent: Nov. 27, 2012

(54) IMMERSION LITHOGRAPHY WAFER EDGE BEAD REMOVAL FOR WAFER AND SCANNER DEFECT PREVENTION

(75) Inventors: Benjamen Michael Rathsack, Austin, TX (US); Mark Howell Somervell, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 676 days.

(21) Appl. No.: 12/339,208

(22) Filed: Dec. 19, 2008

(65) Prior Publication Data

US 2009/0163026 A1    Jun. 25, 2009

Related U.S. Application Data

(60) Provisional application No. 61/016,546, filed on Dec. 24, 2007.

(51) Int. Cl.
*H01L 21/302* (2006.01)

(52) U.S. Cl. ........... 438/748; 438/745; 438/750; 216/42
(58) Field of Classification Search .......... 438/745, 438/750, 751, 725, 748; 430/302, 310, 316; 216/41, 42, 49
See application file for complete search history.

(56) References Cited

U.S. PATENT DOCUMENTS

| | | | |
|---|---|---|---|
| 2007/0093067 A1* | 4/2007 | Chang et al. | 438/704 |
| 2008/0226830 A1* | 9/2008 | Miyagi et al. | 427/402 |
| 2009/0075217 A1* | 3/2009 | Brodsky | 430/327 |

* cited by examiner

*Primary Examiner* — Lan Vinh
(74) *Attorney, Agent, or Firm* — Jacqueline J. Garner; Wade J. Brady, III; Frederick J. Telecky, Jr.

(57) ABSTRACT

A method of performing a single step/single solvent edge bead removal (EBR) process on a photolithography layer stack including a photoresist layer and a top coat layer using propylene glycol monomethyl ether acetate (PGMEA) or a mixture of PGMEA and gamma-butyrolactone (GBL) is disclosed. The single step/single solvent EBR process is compatible with organic and inorganic BARC layers.

13 Claims, 9 Drawing Sheets

IMMERSION LITHOGRAPHY WAFER EDGE BEAD REMOVAL FOR WAFER AND SCANNER DEFECT PREVENTION

FIELD OF THE INVENTION

This invention relates to the field of integrated circuits. More particularly, this invention relates to methods to improve immersion lithography processes used to fabricate integrated circuits.

BACKGROUND OF THE INVENTION

Immersion lithography, in which a liquid, known as an immersion fluid, is inserted between the lens and the wafer, is used to define patterns on some advanced integrated circuits. Typical immersion photolithography processes use a stack of multiple layers of materials, including a bottom anti-reflection coating, commonly known as BARC, an optional second BARC layer, a photoresist layer, and a top coat which reduces reflections, and optionally reduces friction between the wafer and the immersion fluid during wafer movement and/or provides a barrier between the immersion liquid and the photoresist, sometimes called TARC (top anti-reflection coating). These layers are typically applied by spin coating, which produces an edge bead of layer material at the edge of the wafer. The edge bead is commonly removed prior to further photolithographic processing to reduce contamination from fragments of edge bead material that detach from the wafer edge and are distributed across the wafer and on the photolithographic processing equipment. Immersion lithographic processing exacerbates the problem because the immersion fluid picks up fragments of layer material as it passes over the wafer edge, causing pattern defects and particulate contamination. Thus, edge bead removal (EBR) processes must produce a well-defined edge of the layer stack with no extraneous layer material on the wafer. EBR processes are hampered by adhesion incompatibilities between top coat materials and BARC materials. Furthermore, repeated EBR processes can damage BARC layers, resulting in additional particulates.

SUMMARY OF THE INVENTION

This Summary is provided to comply with 37 C.F.R. §1.73, suggesting a summary of the invention briefly indicating the nature and substance of the invention. It is submitted with the understanding that it will not be used to interpret or limit the scope or meaning of the claims.

The need for a method of forming a layered stack of photolithographic materials for immersion lithography with reduced contamination generation is addressed by the instant invention, which provides a novel single step/single solvent edge bead removal (EBR) process on the photoresist and top coat layers in a layered stack including a bottom anti-reflection coating (BARC) layer or layers, a photoresist layer and top coat layer over the BARC stack.

An advantage of the instant invention is a reduction in particulate contamination compared to other methods of forming a layered stack of photolithographic materials for immersion lithography.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for a process sequence for forming a layered stack of photolithographic materials for immersion lithography with reduced particulate contamination is addressed by the instant invention, in which a bottom anti-reflection coating (BARC) layer or layers is formed on a wafer, and a photoresist layer and top coat layer are formed over the BARC stack, by a single step edge bead removal (EBR) process.

Figure 1A:
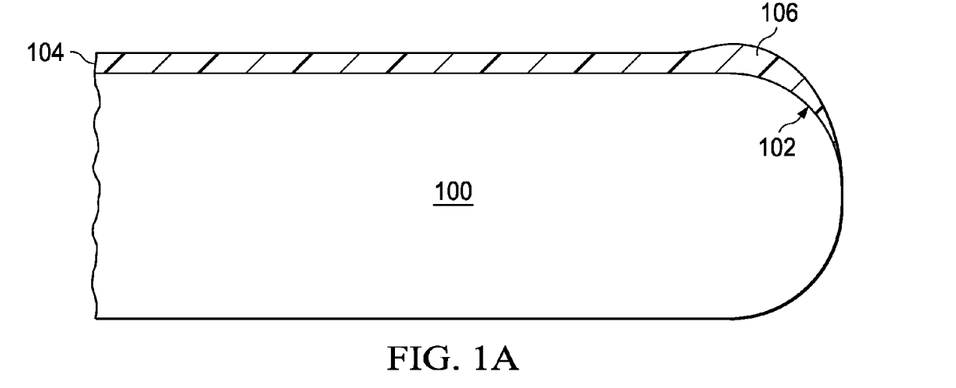
FIG. 1A through FIG. 1G are cross-sections of a wafer edge during formation of a photolithographic layer stack according to the instant invention

FIG. 1A through FIG. 1G are cross-sections of a wafer edge during formation of a photolithographic layer stack according to a first embodiment of the instant invention. FIG. 1A depicts a wafer (100) with an edge region (102) having a radius between 100 and 350 microns. A first BARC layer (104) of a first BARC material is formed on a top surface of the wafer (100), typically by dispensing a measured amount of fluid containing the first BARC material diluted by a first solvent onto the wafer (100) followed by spinning the wafer (100) at several hundred to several thousand rpm while a portion of the first solvent evaporates from the BARC fluid, producing the first BARC layer (104) and a first BARC edge bead (106) along the wafer edge region (102). A composition of the first BARC material and a thickness of the first BARC layer (104) depends on the particular pattern being formed during fabrication of an integrated circuit on the wafer (100), and may be substantially organic, with optional light absorbing dye, or may be substantially inorganic. A thickness of the first BARC layer (104) is commonly between 20 and 500 nanometers.

Figure 1B:
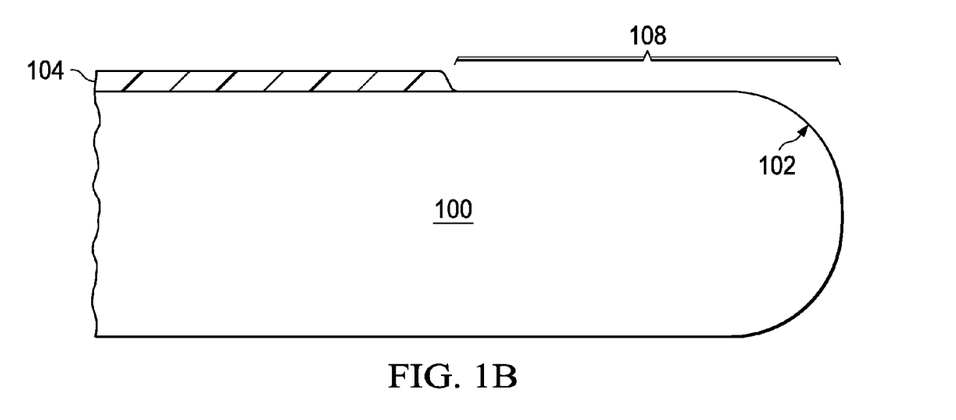

FIG. 1B depicts the wafer (100) after a first EBR process which removes first BARC material from the edge of the wafer in a first BARC WEE zone (108). The first EBR process is performed so that the first BARC WEE zone (108) is substantially free of first BARC material. This is advantageous because contamination resulting from first BARC material is reduced. After the first BARC material is removed from the first BARC WEE zone (108), the first BARC material in the first BARC layer (104) may be cross-linked or otherwise modified to decrease its solubility in and/or aqueous organic solvents.

Figure 1C:
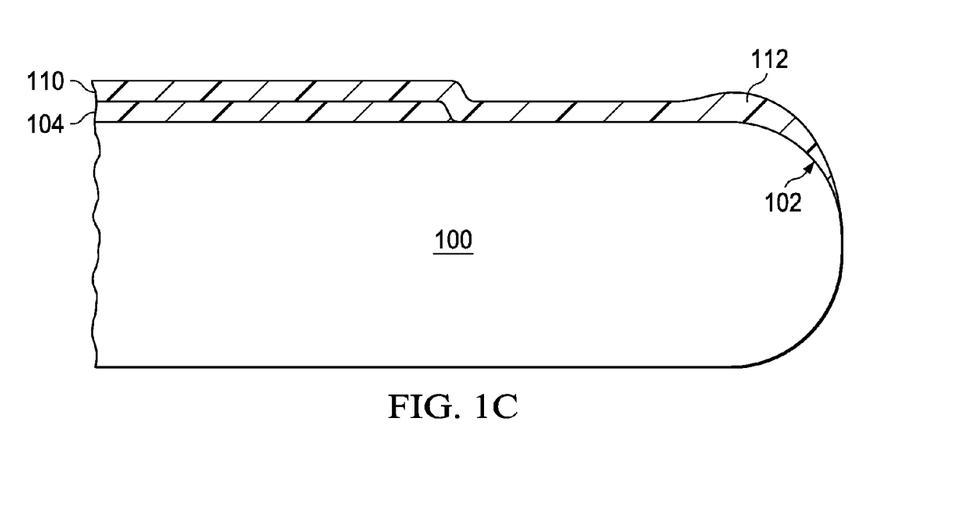

FIG. 1C depicts the wafer (100) after an optional second BARC layer (110) of a second BARC material is formed on a top surface of the first BARC layer (104), by a similar process sequence of dispensing a fluid containing the second BARC material and spinning the wafer (100). A second BARC edge bead (112) is formed at the edge of the wafer (100) adjacent to and atop the first BARC edge bead (106). As with the first BARC layer (104), composition of the second BARC material and a thickness of the second BARC layer (110) depend on the particular pattern being formed during fabrication of an integrated circuit on the wafer (100). A composition of the second BARC layer (110) may be substantially organic or substantially inorganic. In one embodiment, the second BARC layer (110) may be a layer of spin-on glass (SOG). A thickness of the second BARC layer (110) is commonly between 10 and 200 nanometers.

Figure 1D:
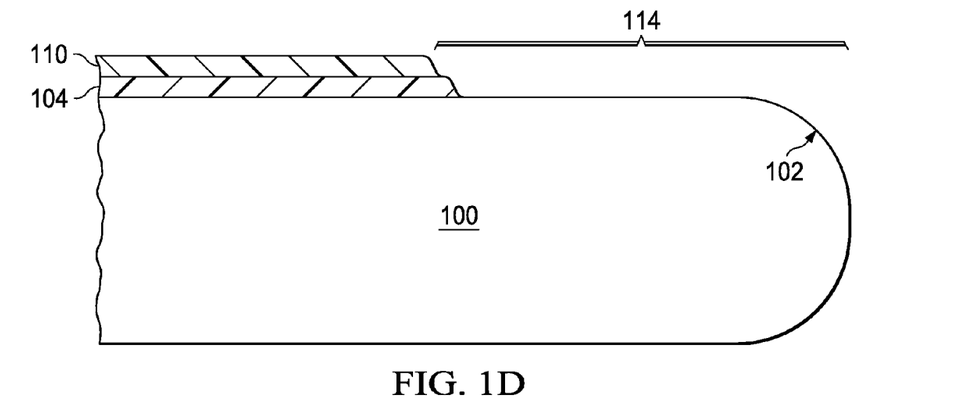

FIG. 1D depicts the wafer (100) after a second EBR process which removes second BARC material from the edge of the wafer in a second BARC WEE zone (114). The second BARC WEE zone (114) may have a different width than the first BARC WEE zone (108). The second EBR process is performed so that the second BARC WEE zone (114) is substantially free of second BARC material. This is advantageous because contamination resulting from second BARC materials is reduced. After the second BARC material is removed from the second BARC WEE zone (114), the second BARC material in the second BARC layer (110) may be cross-linked or otherwise modified to decrease its solubility in organic and/or aqueous solvents.

Figure 1E:
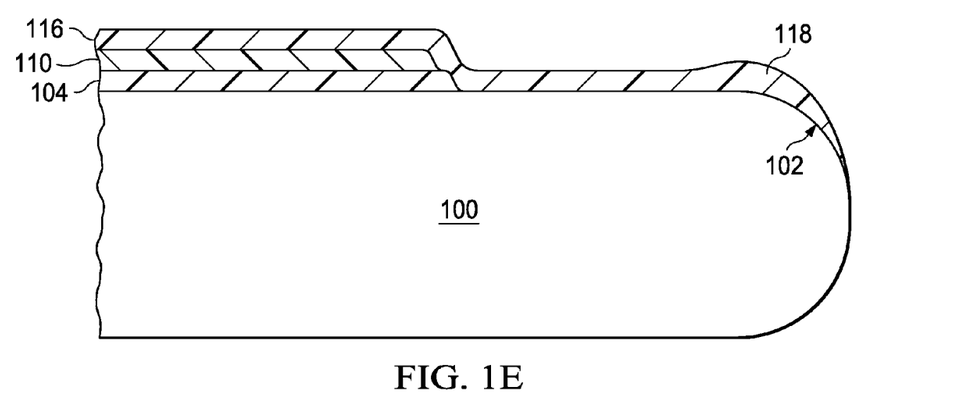

FIG. 1E depicts the wafer (100) after a photoresist layer (116) is formed on a top surface of the second BARC layer (110), if used, or a top surface of the first BARC layer (104), if no second BARC layer is present. Photoresist material in the photoresist layer (116) is typically an amplified deep ultraviolet (DUV) positive-acting photoresist. The photoresist layer (116) is commonly formed by dispensing a measured amount of the photoresist material diluted by a photoresist solvent onto the wafer (100) followed by spinning the wafer (100) at several hundred to several thousand rpm while a portion of the photoresist solvent evaporates from the photoresist/solvent mixture. A photoresist edge bead (118) is formed at the wafer edge (102). After the photoresist layer (116) is formed on the wafer (100), the wafer (100) is baked, commonly at 80 to 150 C for 30 seconds to 60 minutes, to remove a major portion of any remaining photoresist solvent. A thickness of the photoresist layer (116) is commonly between 50 and 500 nanometers thick.

Figure 1F:
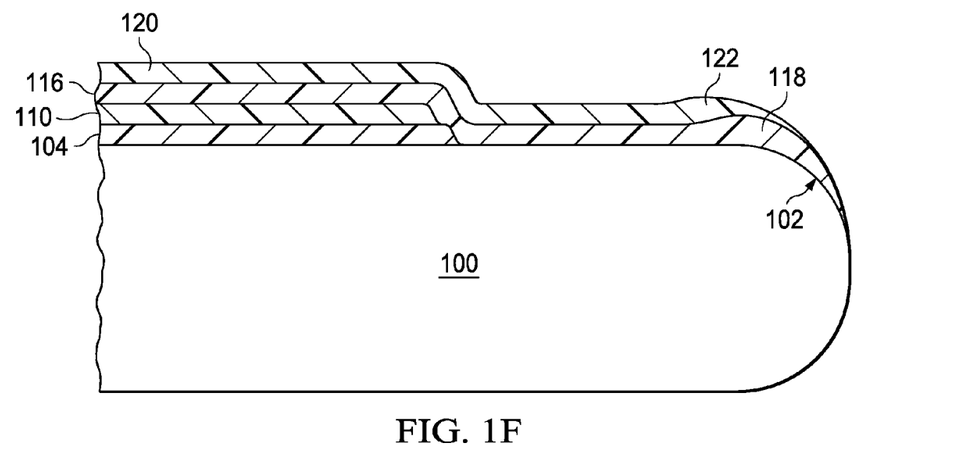

FIG. 1F depicts the wafer (100) after a top coat layer (120) is formed on a top surface of the photoresist layer (116). The top coat layer may provide an anti-reflection function, as well as possibly reducing friction between the wafer and an immersion fluid, used in immersion lithography. The top coat may also serve as a diffusion barrier between an immersion fluid and the photoresist layer (116). The top coat layer (120) is commonly formed by dispensing a mixture of top coat material and second solvent onto the wafer (100) and spinning the wafer to spread the mixture and evaporate a portion the second solvent. A top coat edge bead (122) is formed during this process.

Figure 1G:
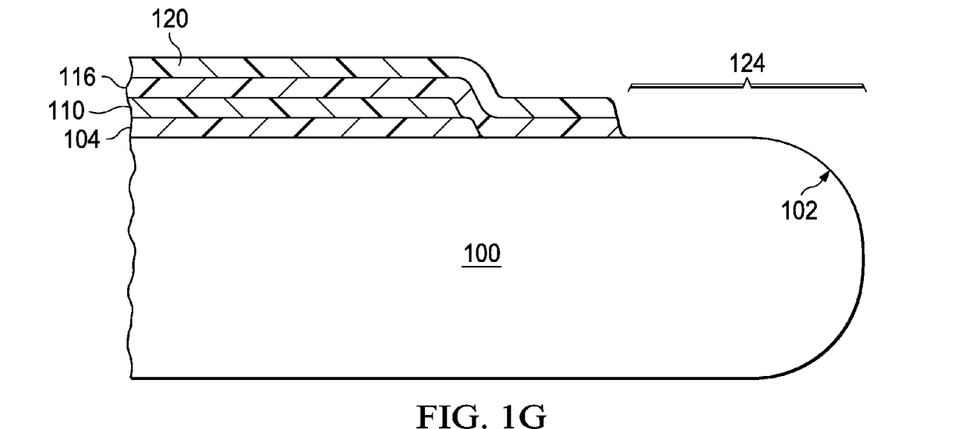

FIG. 1G depicts the wafer (100) after a single step, single solvent photoresist/top coat EBR process. Photoresist material in the photoresist edge bead (118) and top coat material in the top coat edge bead (122) are removed from a photoresist/top coat WEE zone (124). The single step, single solvent photoresist/top coat EBR process uses one solvent to remove both the top coat material and the photoresist from the photoresist/top coat WEE zone (124). Materials used for top coats commonly have poor adhesion to BARC materials or wafer substrates, and contribute to particulate contamination when applied directly to BARC materials or wafer substrates. Thus, removal of top coat material with photoresist during the photoresist/top coat EBR process is advantageous because it reduces contamination from top coat material detaching from the BARC layer (104) or the wafer edge region (102). In one embodiment, the solvent is propylene glycol monomethyl ether acetate (PGMEA). In another embodiment, the solvent is a mixture of 80% PGMEA and 20% gamma-butyrolactone (GBL). It is within the scope of the instant invention to use another mixture of PGMEA and GBL to perform the single step, single solvent photoresist/top coat EBR process. Furthermore, it is within the scope of the instant invention to use another solvent to perform the single step, single solvent photoresist/top coat EBR process. The single step, single solvent photoresist/top coat EBR process is performed by spinning the wafer (100) at 500 to 2000 rpm while dispensing the solvent at 20 to 200 ml/min onto the wafer edge (102) for 3 to 15 sec, followed by spinning the wafer (100) at 1000 to 3000 rpm for 10 to 40 sec at 20 to 30 C to dry the wafer (100). Use of a single solvent in the photoresist/top coat EBR process is advantageous because it reduces dissolution and lifting of the BARC layer (104). Use of a single solvent is furthermore advantageous because it reduces solvent use and process costs and complexity compared to a dual solvent process using separate solvents for the top coat material and the photoresist material.

It will be recognized by practitioners of integrated circuit fabrication that the method disclosed above for forming a layered stack of photolithographic materials may be used in dry lithographic processes as well as immersion lithographic processes to accrue the advantages noted herein.

Figure 2A:
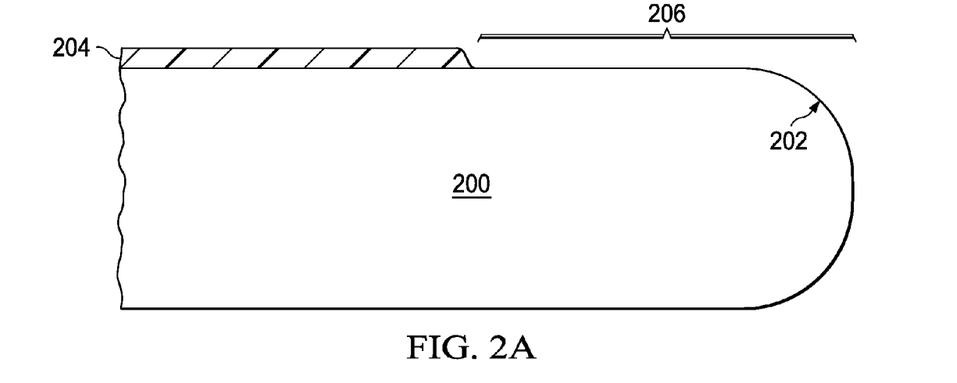
FIG. 2A through FIG. 2D are cross-sections of a wafer edge during formation of a photolithographic layer stack according to a second embodiment of the instant invention.

FIG. 2A through FIG. 2D are cross-sections of a wafer edge during formation of a photolithographic layer stack according to a second embodiment of the instant invention. FIG. 2A depicts a wafer (200) with an edge region (202) having a radius between 100 and 350 microns. A first BARC layer (204) of a first BARC material is formed on a top surface of the wafer (200), typically by dispensing a measured amount of fluid containing the first BARC material diluted by a first solvent onto the wafer (200) followed by spinning the wafer (200) at several hundred to several thousand rpm while a portion of the first solvent evaporates from the BARC fluid, producing the first BARC layer (204) and a first BARC edge bead along the wafer edge region (202). A composition of the first BARC material and a thickness of the first BARC layer (204) depends on the particular pattern being formed during fabrication of an integrated circuit on the wafer (200), and may be substantially organic, with optional light absorbing dye, or may be substantially inorganic. A thickness of the first BARC layer (204) is commonly between 20 and 500 nanometers. A first EBR process is performed which removes first BARC material from the edge of the wafer in a first BARC WEE zone (206). The first EBR process is performed so that the first BARC WEE zone (206) is substantially free of first BARC material. This is advantageous because contamination resulting from first BARC material is reduced. After the first BARC material is removed from the first BARC WEE zone (206), the first BARC material in the first BARC layer (204) may be cross-linked or otherwise modified to decrease its solubility in and/or aqueous organic solvents.

Figure 2B:
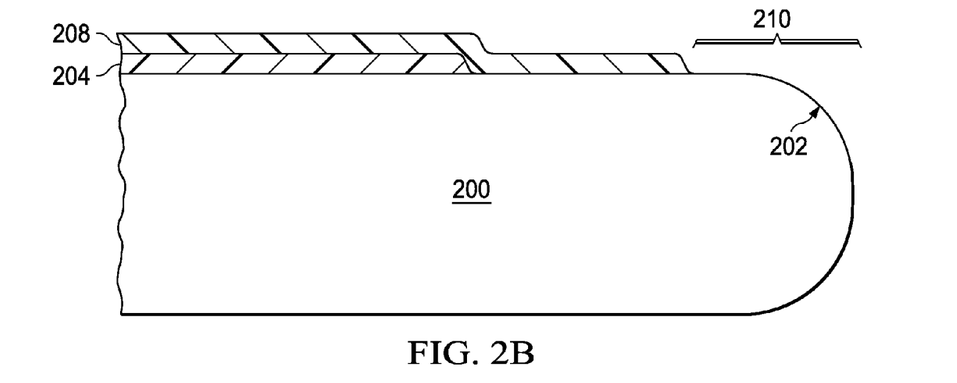

FIG. 2B depicts the wafer (200) after an optional second BARC layer (208) of a second BARC material is formed on a top surface of the first BARC layer (204), by a similar process sequence of dispensing a fluid containing the second BARC material and spinning the wafer (200). A second BARC edge bead is formed at the edge of the wafer (200). As with the first BARC layer (204), composition of the second BARC material and a thickness of the second BARC layer (208) depend on the particular pattern being formed during fabrication of an integrated circuit on the wafer (200). A composition of the second BARC layer (208) may be substantially organic or substantially inorganic. In one embodiment, the second BARC layer (208) may be a layer of SOG. A thickness of the second BARC layer (208) is commonly between 10 and 200 nanometers. A second EBR process is performed which removes second BARC material from the edge of the wafer in a second BARC WEE zone (210). The second BARC WEE zone (210) may have a different width than the first BARC WEE zone (206). The second EBR process is performed so that the second BARC WEE zone (210) is substantially free of second BARC material. This is advantageous because particulate contamination resulting from second BARC material is reduced. After the second BARC material is removed from the second BARC WEE zone (210), the second BARC material in the second BARC layer (208) may be cross-linked or otherwise modified to decrease its solubility in organic and/or aqueous solvents.

Figure 2C:
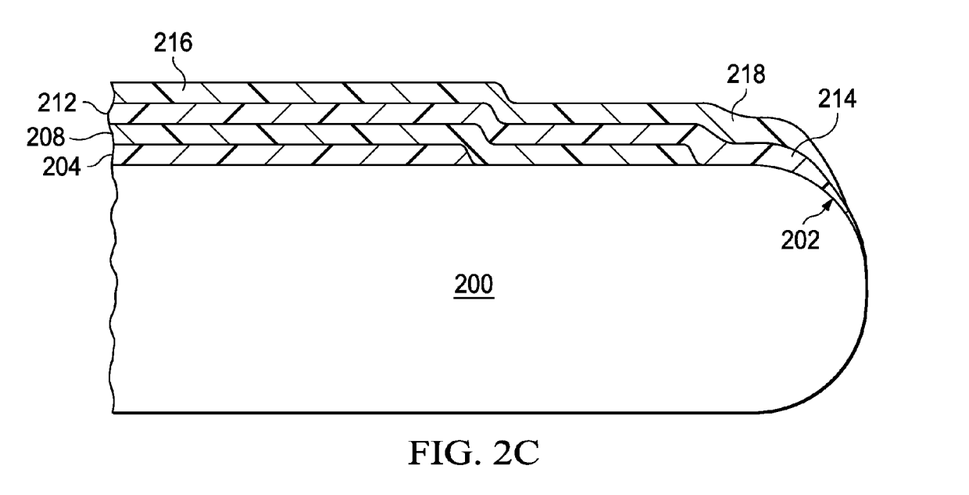

FIG. 2C depicts the wafer (200) after a photoresist layer (212) is formed on a top surface of the second BARC layer (208), if used, or a top surface of the first BARC layer (204), if no second BARC layer is present. Photoresist material in the photoresist layer (212) is typically an amplified deep ultraviolet (DUV) positive-acting photoresist. The photoresist layer (212) is commonly formed by dispensing a measured amount of the photoresist material diluted by a photoresist solvent onto the wafer (200) followed by spinning the wafer (200) at several hundred to several thousand rpm while a portion of the photoresist solvent evaporates from the photoresist/solvent mixture. A photoresist edge bead (214) is formed at the wafer edge (202). After the photoresist layer (212) is formed on the wafer (200), the wafer (200) is baked, commonly at 80 to 150 C for 30 seconds to 60 minutes, to remove a major portion of any remaining photoresist solvent. A thickness of the photoresist layer (212) is commonly between 50 and 500 nanometers thick. A top coat layer (216) is formed on a top surface of the photoresist layer (212). The top coat layer (216) may provide an anti-reflection function, as well as possibly reducing friction between the wafer and an immersion fluid, used in immersion lithography. The top coat layer (216) may also serve as a diffusion barrier between an immersion fluid and the photoresist layer (212). The top coat layer (216) is commonly formed by dispensing a mixture of top coat material and second solvent onto the wafer (200) and spinning the wafer to spread the mixture and evaporate a portion the second solvent. A top coat edge bead (218) is formed at the wafer edge (202) during this process.

Figure 2D:
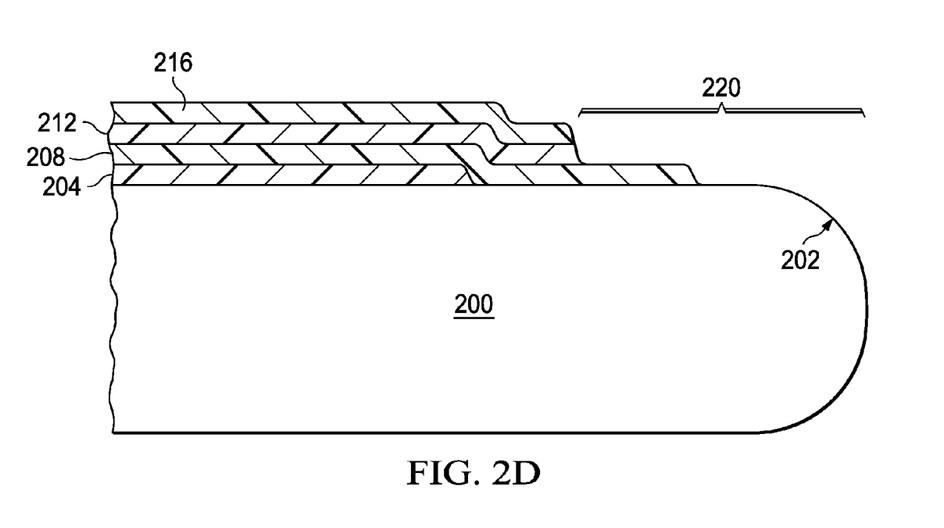

FIG. 2D depicts the wafer (200) after a single step, single solvent photoresist/top coat EBR process. Photoresist material in the photoresist edge bead (214) and top coat material in the top coat edge bead (218) are removed from a photoresist/top coat WEE zone (220). The single step, single solvent photoresist/top coat EBR process uses one solvent to remove both the top coat material and the photoresist from the photoresist/top coat WEE zone (220). Materials used for top coats commonly have poor adhesion to BARC materials or wafer substrates, and contribute to particulate contamination when applied directly to BARC materials or wafer substrates. Thus, removal of top coat material with photoresist during the photoresist/top coat EBR process is advantageous because it reduces contamination from top coat material detaching from the BARC layer (204) or the wafer edge region (202). In one embodiment, the solvent is propylene glycol monomethyl ether acetate (PGMEA). In another embodiment, the solvent is a mixture of 80% PGMEA and 20% gamma-butyrolactone (GBL). It is within the scope of the instant invention to use another mixture of PGMEA and GBL to perform the single step, single solvent photoresist/top coat EBR process. Furthermore, it is within the scope of the instant invention to use another solvent to perform the single step, single solvent photoresist/top coat EBR process. The single step, single solvent photoresist/top coat EBR process is performed by spinning the wafer (200) at 500 to 2000 rpm while dispensing the solvent at 20 to 200 ml/min onto the wafer edge (202) for 3 to 15 sec, followed by spinning the wafer (200) at 1000 to 3000 rpm for 10 to 40 sec at 20 to 30 C to dry the wafer (200). Use of a single solvent in the photoresist/top coat EBR process is advantageous because it reduces dissolution and lifting of the BARC layer (204). Use of a single solvent is furthermore advantageous because it reduces solvent use and process costs and complexity compared to a dual solvent process using separate solvents for the top coat material and the photoresist material.

FIG. 3 through FIG. 12 depict cross-sections of wafers with photolithographic layer stacks formed according to alternate embodiments of the instant invention. In each embodiment, properties of wafers, and photoresists, BARC materials and top coat materials and their respective layers are as described in reference to FIG. 1A through FIG. 1G.

Figure 3:
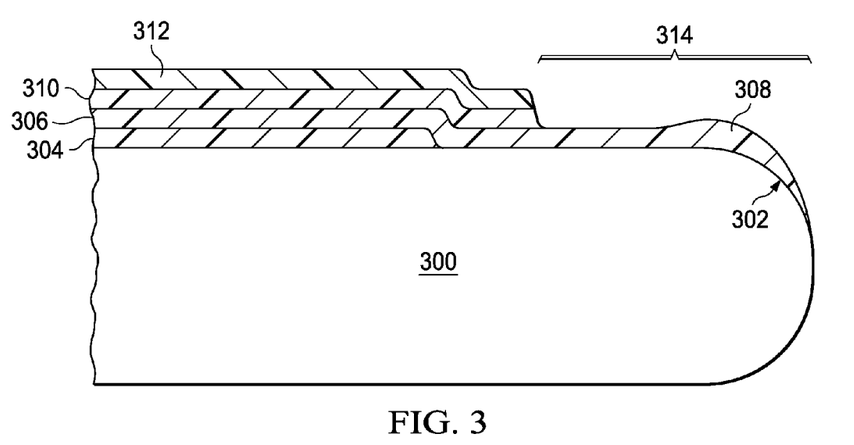
FIG. 3 through FIG. 12 depict cross-sections of wafers with photolithographic layer stacks formed according to alternate embodiments of the instant invention.

FIG. 3 depicts a wafer (300) with an edge region (302), on which a first BARC layer (304) is formed on a top surface of the wafer (300). A first EBR process removes first BARC material from the wafer edge (302) in a first BARC WEE zone. A second BARC layer (306) and a first BARC edge bead (308) are formed on a top surface of the first BARC layer (304) and the top surface of the wafer (300). No EBR process is performed on the second BARC layer (306) and first BARC edge bead (308). A photoresist layer (310) is formed on a top surface of the second BARC layer (306). A top coat layer (312) is formed on a top surface of the photoresist layer (310). A single step, single solvent photoresist/top coat EBR process removes photoresist material in the photoresist edge bead and top coat material in the top coat edge bead from a photoresist/top coat WEE zone (314), which is wider than the first BARC WEE zone.

Figure 4:
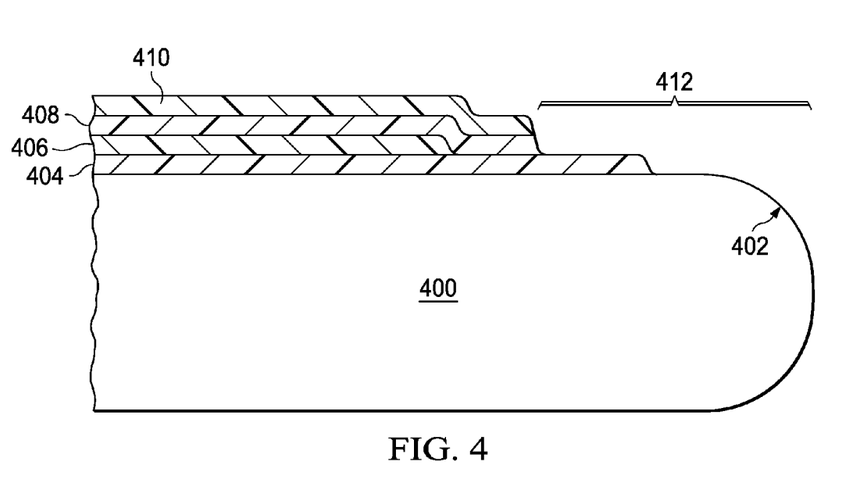

FIG. 4 depicts a wafer (400) with an edge region (402), on which a first BARC layer (404) is formed on a top surface of the wafer (400). A first EBR process removes first BARC material from the wafer edge (402) in a first BARC WEE zone. A second BARC layer (406) is formed on a top surface of the first BARC layer (404). A second EBR process removes second BARC material from the wafer edge (402) in a second BARC WEE zone, which is wider than the first BARC WEE zone. A photoresist layer (408) is formed on a top surface of the second BARC layer (406) and the top surface of the first BARC layer (404). A top coat layer (410) is formed on a top surface of the photoresist layer (408). A single step, single solvent photoresist/top coat EBR process removes photoresist material in the photoresist edge bead and top coat material in the top coat edge bead from a photoresist/top coat WEE zone (412), which is wider than the first BARC WEE zone, but narrower than the second BARC WEE zone.

Figure 5:
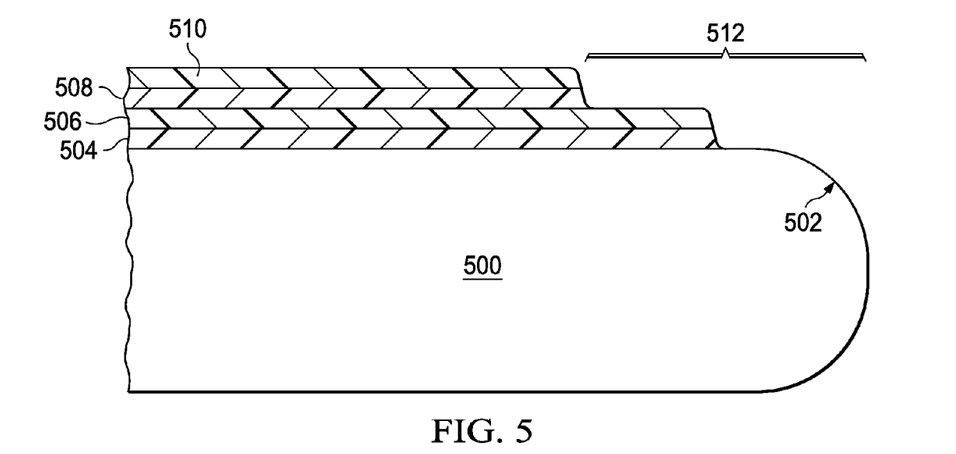

FIG. 5 depicts a wafer (500) with an edge region (502), on which a first BARC layer (504) is formed on a top surface of the wafer (500). A first EBR process removes first BARC material from the wafer edge (502) in a first BARC WEE zone. A second BARC layer (506) is formed on a top surface of the first BARC layer (504). A second EBR process removes second BARC material from the wafer edge (502) in a second BARC WEE zone, which is substantially as wide as the first BARC WEE zone. A photoresist layer (508) is formed on a top surface of the second BARC layer (506). A top coat layer (510) is formed on a top surface of the photoresist layer (508). A single step, single solvent photoresist/top coat EBR process removes photoresist material in the photoresist edge bead and top coat material in the top coat edge bead from a photoresist/top coat WEE zone (512), which is wider than the first and second BARC WEE zones.

Figure 6:
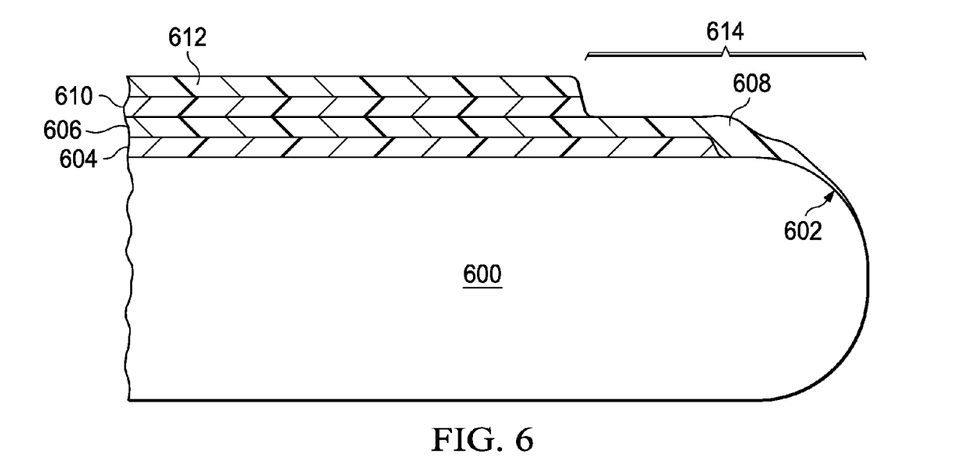

FIG. 6 depicts a wafer (600) with an edge region (602), on which a first BARC layer (604) is formed on a top surface of the wafer (600). A first EBR process removes first BARC material from the wafer edge (602) in a first BARC WEE zone. A second BARC layer (606) and a first BARC edge bead (608) are formed on a top surface of the first BARC layer (604) and the top surface of the wafer (600). No EBR process is performed on the second BARC layer (606) and first BARC edge bead (608). A photoresist layer (610) is formed on a top surface of the second BARC layer (606). A top coat layer (612) is formed on a top surface of the photoresist layer (610). A single step, single solvent photoresist/top coat EBR process removes photoresist material in the photoresist edge bead and top coat material in the top coat edge bead from a photoresist/top coat WEE zone (614), which is narrower than the first BARC WEE zone.

Figure 7:
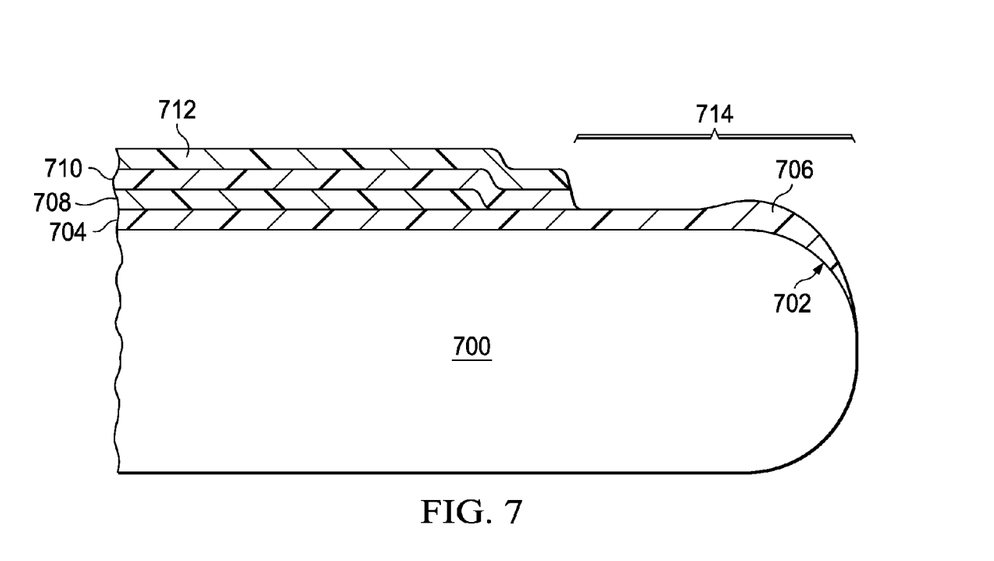

FIG. 7 depicts a wafer (700) with an edge region (702), on which a first BARC layer (704) and a first BARC edge bead (706) are formed on a top surface of the wafer (700). No EBR process is performed on the first BARC layer (704) and first BARC edge bead (706). A second BARC layer (708) is formed on a top surface of the first BARC layer (704). A first EBR process removes second BARC material from the wafer edge (702) in a first BARC WEE zone. A photoresist layer (710) is formed on a top surface of the second BARC layer (708). A top coat layer (712) is formed on a top surface of the photoresist layer (710). A single step, single solvent photoresist/top coat EBR process removes photoresist material in the photoresist edge bead and top coat material in the top coat edge bead from a photoresist/top coat WEE zone (714), which is narrower than the first BARC WEE zone.

Figure 8:
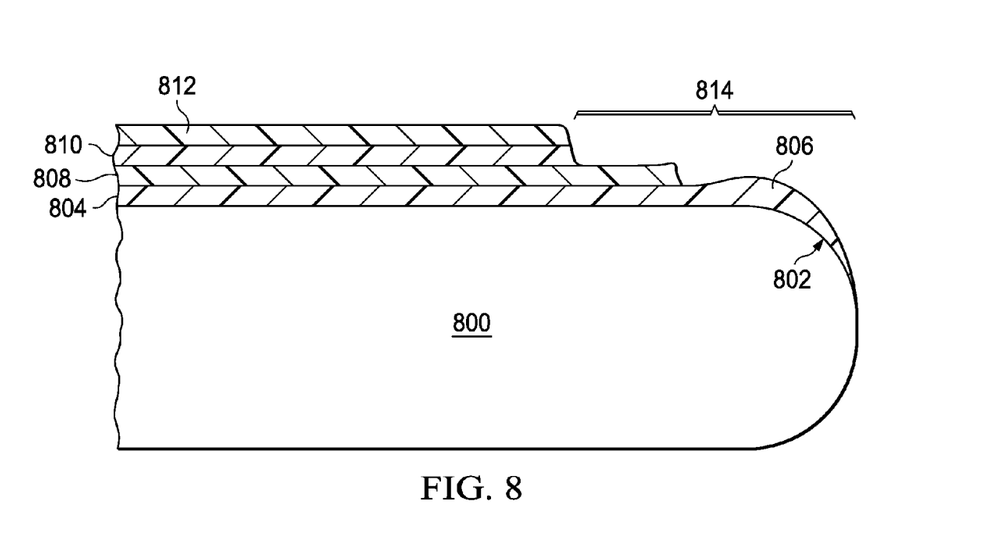

FIG. 8 depicts a wafer (800) with an edge region (802), on which a first BARC layer (804) and a first BARC edge bead (806) are formed on a top surface of the wafer (800). No EBR process is performed on the first BARC layer (804) and first BARC edge bead (806). A second BARC layer (808) is formed on a top surface of the first BARC layer (804). A first EBR process removes second BARC material from the wafer edge (802) in a first BARC WEE zone. A photoresist layer (810) is formed on a top surface of the second BARC layer (808). A top coat layer (812) is formed on a top surface of the photoresist layer (810). A single step, single solvent photoresist/top coat EBR process removes photoresist material in the photoresist edge bead and top coat material in the top coat edge bead from a photoresist/top coat WEE zone (814), which is wider than the first BARC WEE zone.

Figure 9:
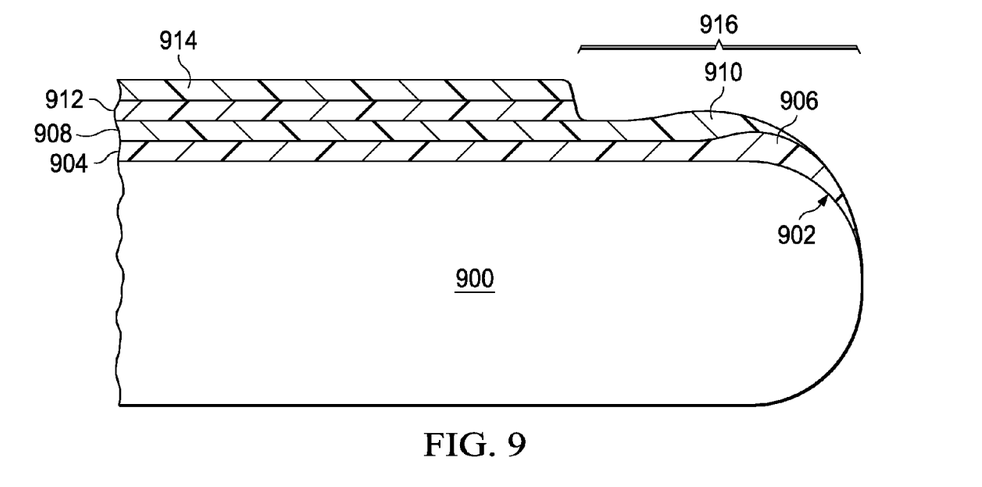

FIG. 9 depicts a wafer (900) with an edge region (902), on which a first BARC layer (904) and a first BARC edge bead (906) are formed on a top surface of the wafer (900). No EBR process is performed on the first BARC layer (904) and first BARC edge bead (906). A second BARC layer (908) and a second BARC edge bead (910) are formed on a top surface of the first BARC layer (904). No EBR process is performed on the second BARC layer (908) and second BARC edge bead (910). A photoresist layer (912) is formed on a top surface of the second BARC layer (908). A top coat layer (914) is formed on a top surface of the photoresist layer (912). A single step, single solvent photoresist/top coat EBR process removes photoresist material in the photoresist edge bead and top coat material in the top coat edge bead from a photoresist/top coat WEE zone (916).

Figure 10:
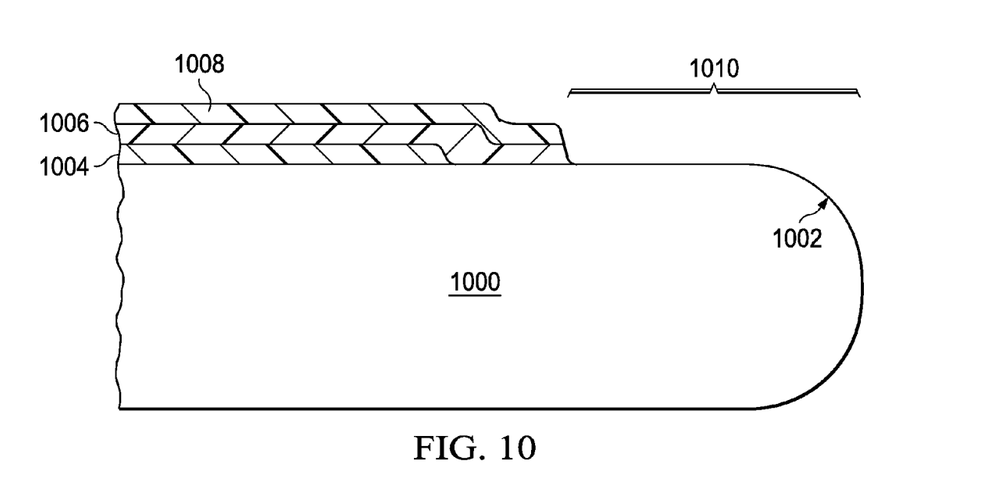

FIG. 10 depicts a wafer (1000) with an edge region (1002), on which a first BARC layer (1004) is formed on a top surface of the wafer (1000). A first EBR process removes first BARC material from the wafer edge (1002) in a first BARC WEE zone. A photoresist layer (1006) is formed on a top surface of the first BARC layer (1004) and the top surface of the wafer (1000). A top coat layer (1008) is formed on a top surface of the photoresist layer (1006). A single step, single solvent photoresist/top coat EBR process removes photoresist material in the photoresist edge bead and top coat material in the top coat edge bead from a photoresist/top coat WEE zone (1010), which is narrower than the first BARC WEE zone.

Figure 11:
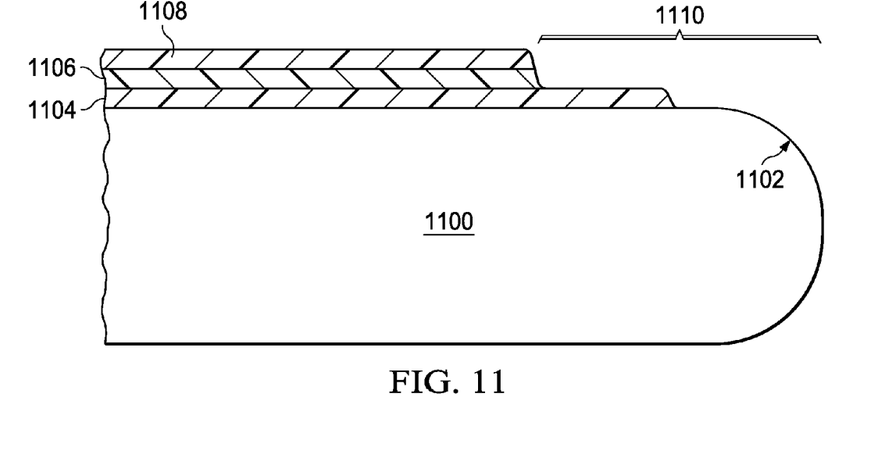

FIG. 11 depicts a wafer (1100) with an edge region (1102), on which a first BARC layer (1104) is formed on a top surface of the wafer (1100). A first EBR process removes first BARC material from the wafer edge (1102) in a first BARC WEE zone. A photoresist layer (1106) is formed on a top surface of the first BARC layer (1104) and the top surface of the wafer (1100). A top coat layer (1108) is formed on a top surface of the photoresist layer (1106). A single step, single solvent photoresist/top coat EBR process removes photoresist material in the photoresist edge bead and top coat material in the top coat edge bead from a photoresist/top coat WEE zone (1110), which is wider than the first BARC WEE zone.

Figure 12:
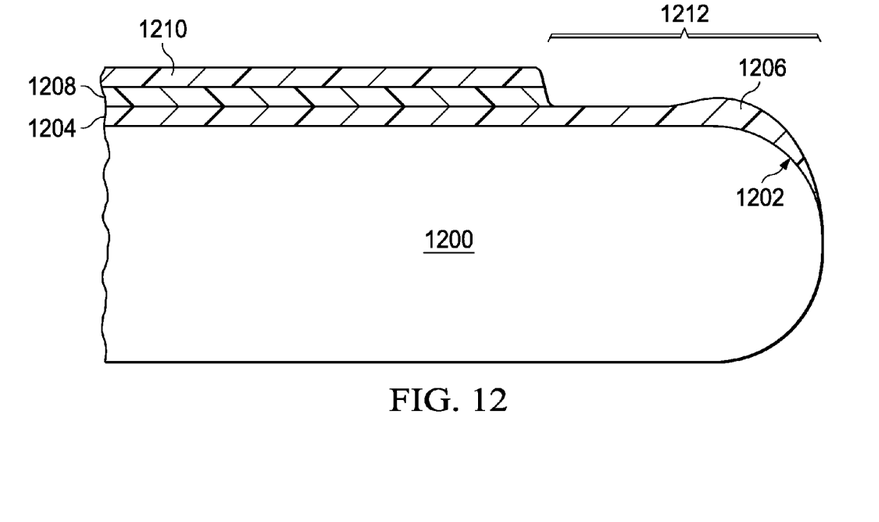

FIG. 12 depicts a wafer (1200) with an edge region (1202), on which a first BARC layer (1204) and a first BARC edge bead (1206) are formed on a top surface of the wafer (1200). No EBR process is performed on the first BARC layer (1204) and first BARC edge bead (1206). A photoresist layer (1208) is formed on a top surface of the first BARC layer (1204). A top coat layer (1210) is formed on a top surface of the photoresist layer (1208). A single step, single solvent photoresist/top coat EBR process removes photoresist material in the photoresist edge bead and top coat material in the top coat edge bead from a photoresist/top coat WEE zone (1212).

In each embodiment described in reference to FIG. 3 through FIG. 12, removal of top coat material with photoresist during the photoresist/top coat EBR process is advantageous because it reduces contamination from top coat material detaching from the BARC layer, second BARC layer and/or the wafer edge region. Additionally, use of a single solvent in the photoresist/top coat EBR process is advantageous because it reduces dissolution and lifting of the BARC layer and/or second BARC layer. Use of a single solvent is furthermore advantageous because it reduces solvent use and process costs and complexity compared to a dual solvent process using separate solvents for the top coat material and the photoresist material.

What is claimed is:

1. A method of forming a photolithography layer stack comprising a bottom anti-reflection coat (BARC) layer, a photoresist layer and a top coat layer on a semiconductor wafer, by a process comprising the steps of:
    performing a single step/single solvent photoresist/top coat edge bead removal (EBR) process on said photoresist layer and said top coat layer to form a photoresist/top coat wafer edge exclusion (WEE) zone at an edge of said semiconductor wafer; and
    performing an EBR process on said BARC layer before forming said photoresist layer, wherein a WEE zone of said BARC layer is wider than said photoresist/top coat WEE zone.

2. The method of claim 1, in which said single step/single solvent photoresist/top coat EBR process further comprises the steps of:
- spinning said semiconductor wafer at 500 to 2000 rpm; and
- dispensing EBR solvent at 20 to 200 ml/min for 3 to 15 sec onto said photoresist layer and said top coat layer at said edge of said semiconductor wafer.

3. The method of claim 2, in which said EBR solvent is propylene glycol monomethyl ether acetate (PGMEA).

4. The method of claim 2, in which said EBR solvent is a mixture of 80% PGMEA and 20% gamma-butyrolactone (GBL).

5. The method of claim 2, further comprising the step of forming a layer of spin-on glass (SOG) on a top surface of said BARC layer.

6. The method of claim 5, further comprising the step of performing an EBR process on said layer of SOG before forming said photoresist layer.

7. The method of claim 6, in which a WEE zone of said layer of SOG is different from said WEE zone of said BARC layer.

8. A method of performing immersion lithography on a semiconductor wafer comprising the steps of:
- forming a BARC layer on a top surface of said semiconductor wafer by dispensing BARC material on a top surface of said semiconductor wafer and spinning said semiconductor wafer to spread said BARC material over said top surface of said semiconductor wafer;
- forming a photoresist layer on a top surface of said BARC layer a process further comprising the steps of:
  - dispensing a mixture of photoresist and a solvent on said top surface of said BARC layer;
  - spinning said semiconductor wafer at 200 to 10,000 rpm to spread said mixture of photoresist and said solvent over said top surface of said BARC layer; and
  - baking said semiconductor wafer to further remove a second portion of said solvent;
- forming a top coat layer on a top surface of said photoresist layer by dispensing top coat material on said top surface of said photoresist layer and spinning said semiconductor wafer to spread said top coat material over said top surface of said photoresist layer;
- performing a single step/single solvent photoresist/top coat EBR process on said photoresist layer and said top coat layer to form a photoresist/top coat WEE zone at an edge of said semiconductor wafer by:
  - spinning said semiconductor wafer at 500 to 2000 rpm; and
  - dispensing EBR solvent at 20 to 200 ml/min for 3 to 15 sec onto said photoresist layer and said top coat layer at said edge of said semiconductor wafer; and
- performing an EBR process on said BARC layer before forming said photoresist layer, wherein a WEE zone of said BARC layer is wider than said photoresist/top coat WEE zone.

9. The method of claim 8, in which said EBR solvent is propylene glycol monomethyl ether acetate (PGMEA).

10. The method of claim 8, in which said EBR solvent is a mixture of 80% PGMEA and 20% gamma-butyrolactone (GBL).

11. The method of claim 8, further comprising the step of forming a layer of SOG on a top surface of said BARC layer.

12. The method of claim 11, further comprising the step of performing an EBR process on said layer of SOG before forming said photoresist layer.

13. The method of claim 12, in which a WEE zone of said layer of SOG is different from said WEE zone of said BARC layer.

* * * * *